United States Patent
Imanishi et al.

(10) Patent No.: US 7,693,199 B2
(45) Date of Patent: Apr. 6, 2010

(54) LASER DIODE

(75) Inventors: Daisuke Imanishi, Kanagawa (JP);
Shigeki Miyazaki, Kanagawa (JP);
Kaori Naganuma, Kanagawa (JP);
Yoshiro Takiguchi, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 12/049,884

(22) Filed: Mar. 17, 2008

(65) Prior Publication Data

US 2008/0232415 A1 Sep. 25, 2008

(30) Foreign Application Priority Data

Mar. 22, 2007 (JP) .............. 2007-074074

(51) Int. Cl.
*H01S 5/00* (2006.01)
(52) U.S. Cl. .................. 372/45.01
(58) Field of Classification Search .......... 372/45.01
See application file for complete search history.

(56) References Cited

U.S. PATENT DOCUMENTS 4,592,060 A * 5/1986 Hayakawa et al. ..... 372/44.011
5,496,767 A * 3/1996 Yoshida ................. 117/89
6,479,334 B1 * 11/2002 Codama et al. .......... 438/161
2007/0176203 A1 * 8/2007 Kuramoto ............... 257/192

FOREIGN PATENT DOCUMENTS

| JP | 05-021894 | 1/1993 |
| JP | 2002-261376 | 9/2002 |
| JP | 2006-049420 | 2/2006 |
| JP | 2006286868 | 10/2006 |

OTHER PUBLICATIONS

A Japanese Office Action dated Nov. 11, 2008 issued in connection with counterpart Japanese Patent Application No. 2007-074074.
A Japanese Office Action dated Apr. 23, 2009 issued in connection with counterpart Japanese Patent Application No. 2007-074074.

* cited by examiner

*Primary Examiner*—Minsun Harvey
*Assistant Examiner*—Patrick Stafford
(74) *Attorney, Agent, or Firm*—Sonnenschein Nath & Rosenthal LLP

(57) ABSTRACT

A laser diode capable of operating at high temperature by preventing carrier overflow is provided. A laser diode includes an AlGaInP-based laminate configuration including at least a lower cladding layer, an active layer and an upper cladding layer in this order, wherein the AlGaInP-based laminate configuration receives a larger compressive stress than 2200 ppm from a stress source.

8 Claims, 10 Drawing Sheets

LASER DIODE

CROSS REFERENCES TO RELATED APPLICATIONS

The present invention contains subject matter related to Japanese Patent Application JP 2007-074074 filed in the Japanese Patent Office on Mar. 22, 2007, the entire contents of which being incorporated herein by reference.

BACKGROUND OF THE INVENTION

1. Field of the Invention

The present invention relates to a laser diode used in a light source for optical disks, optical communications or displays.

2. Description of the Related Art

In recent years, write-once DVD (Digital Versatile Disk) drives have rapidly become widespread. For reading and writing by the DVD drives, a red semiconductor LD (Laser Diode) in which an AlGaInP-based semiconductor is laminated on a GaAs substrate is used. For example, as shown in FIG. 11, a red semiconductor LD 100 has a configuration in which a lower cladding layer 111 made of AlInP, a lower guide layer 112 made of AlGaInP, an active layer 113 made of GaInP, an upper guide layer 114 made of AlGaInP, an upper cladding layer 115 made of AlInP and a contact layer 116 are laminated in this order on a GaAs substrate 110, and includes an upper electrode 117 on the contact layer 116 and a lower electrode 118 on the back surface of the GaAs substrate 110 (for example, refer to Japanese Unexamined Patent Application Publication No. H5-21894). In the red semiconductor LD 100 with such a configuration, when a voltage is applied between the upper electrode 117 and the lower electrode 118, for example, electrons and holes are injected into the active layer 113 from the lower electrode 118 and the upper electrode 117, respectively. Then, the electrons and holes injected into the active layer 113 are recombined to generate (emit) photons.

SUMMARY OF THE INVENTION

In the red semiconductor LD 100, as shown in FIG. 12, it is not easy to increase an energy difference (an electronic barrier) $\Delta E_c$ between a bottom 113A of a conduction band in the active layer 113 and a bottom 115A of a conduction band in a p-type cladding layer 115. Therefore, at high temperature, so-called carrier overflow in which electrons pass over the electronic barrier $\Delta E_c$ to be leaked from the active layer 14 may occur in the p-type cladding layer 115.

Therefore, to overcome such an issue, for example, a method of preventing carrier overflow in the p-type cladding layer 115 by increasing the carrier concentration of the p-type cladding layer 115 is considered. However, it is not easy to increase the carrier concentration of the p-type cladding layer 115, and when the carrier concentration is too high, crystallinity may decline and reliability may be damaged.

In view of the foregoing, it is desirable to provide a laser diode capable of operating at high temperature by preventing carrier overflow.

According to an embodiment of the invention, there is provided a laser diode including: an AlGaInP-based laminate configuration including at least a lower cladding layer, an active layer and an upper cladding layer in this order. The AlGaInP-based laminate configuration receives a compressive stress ranging from larger than 2200 ppm to 12000 ppm or less from a stress source. In addition, any other layer may be inserted between the substrate and the AlGaInP-based laminate configuration, between the lower cladding layer and the active layer, or between the active layer and the upper cladding layer.

In the laser diode according to the embodiment of the invention, the AlGaInP-based laminate configuration mounted on the substrate receives a compressive stress ranging from larger than 2200 ppm to 12000 ppm or less from a stress source. Thereby, in the case where the magnitude of the compressive stress from the stress source is set according to the kind and magnitude of a stress applied from the lower cladding layer and the upper cladding layer to the active layer, an energy difference (an electronic barrier) between a bottom of a conduction band (or a bottom of a subband) in the active layer and a bottom of a conduction band (a bottom of a subband) in the lower cladding layer and the upper cladding layer can be increased.

In the laser diode according to the embodiment of the invention, the electronic barrier can be increased, so carrier overflow can be prevented. Thereby, high-temperature operation can be implemented.

Other and further objects, features and advantages of the invention will appear more fully from the following description.

DETAILED DESCRIPTION OF THE PREFERRED EMBODIMENTS

A preferred embodiment will be described in detail below referring to the accompanying drawings.

Figure 1:
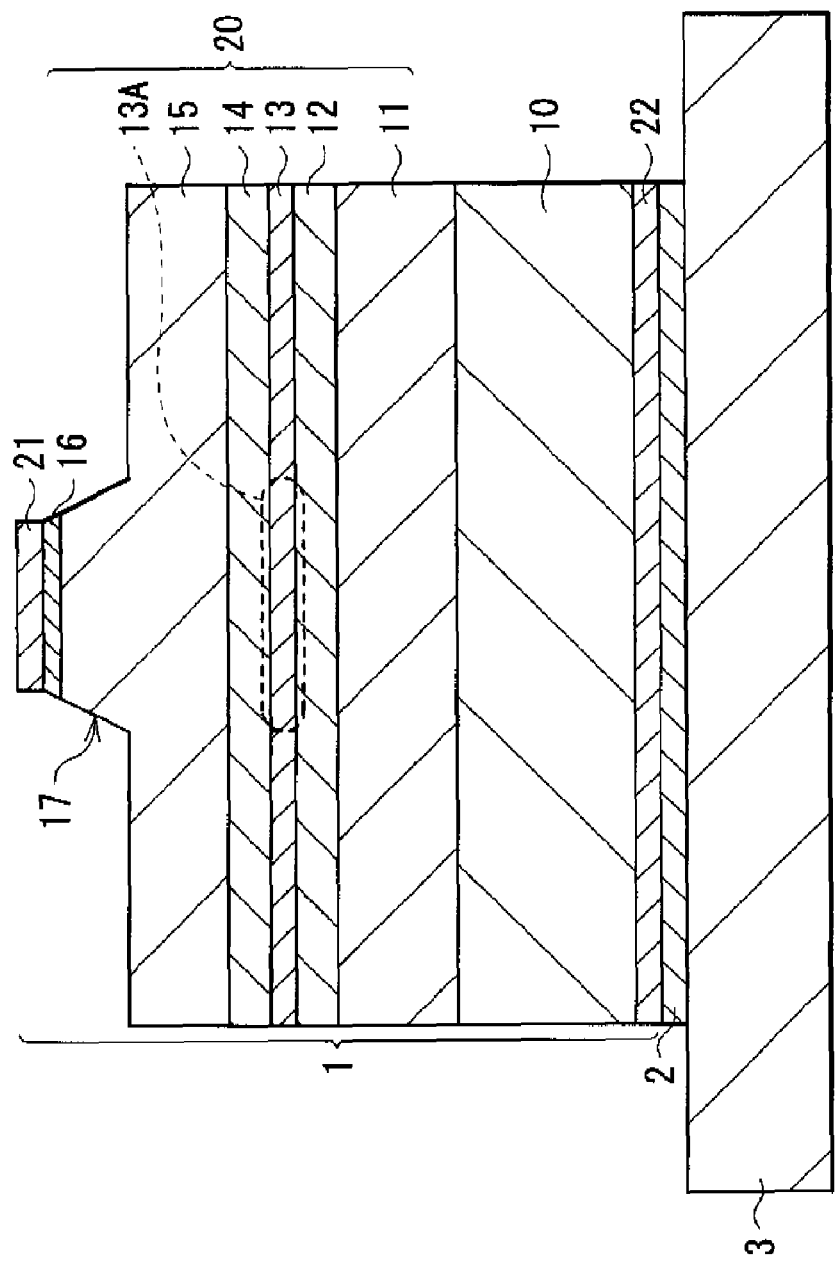
FIG. 1 is a sectional view of a laser diode according to an embodiment of the invention.

FIG. 1 shows a sectional view of a laser diode according to an embodiment of the invention. In the laser diode, a laser diode device 1 including an AlGaInP-based laminate configuration 20 on a substrate 10 is mounted on a heat sink (a mounting board) 3 with solder 2 in between, and red laser light is emitted from the laser diode device 1.

The laminate configuration 20 is formed by laminating a lower cladding layer 11, a lower guide layer 12, an active layer 13, an upper guide layer 14, an upper cladding layer 15 and a contact layer 16 in this order from the substrate 10. In this case, a striped ridge (a projection) 17 extending in a direction of laser light emission (an axial direction) is formed in a part of the contact layer 16 and a part of the upper cladding layer 15. Hereinafter, the direction where the above-described semiconductor layers are laminated is referred to as a longitudinal direction, and a direction perpendicular to the axial direction and the longitudinal direction is referred to as a lateral direction.

The substrate 10 is, for example, an n-type GaAs substrate with a thickness in the longitudinal direction (hereinafter simply referred to as thickness) of 100 µm. In this case, examples of an n-type impurity include silicon (Si), selenium (Se) and the like. The lower cladding layer 11 is made of, for example, n-type AlInP, n-type AlGaInP or the like with a thickness of 1 µm. The lower guide layer 12 is made of, for example, n-type AlInP, n-type AlGaInP or the like with a thickness of 50 nm.

The active layer 13 is made of, for example, undoped GaInP with a thickness of approximately 5 nm. The active layer 13 includes a light emission region 13A in a region facing the ridge 17. The light emission region 13A has a stripe width equivalent to that of a bottom part (a part of the upper cladding layer 15) of the facing ridge 17, and corresponds to a current injection region where a current confined in the ridge 17 is injected.

The upper guide layer 14 is made of, for example, p-type AlInP, p-type AlGaInP or the like with a thickness of 50 nm. In this case, as a p-type impurity, zinc (Zn), magnesium (Mg), beryllium (Be) or the like is used. The upper cladding layer 15 is made of, for example, p-type AlInP, p-type AlGaInP or the like with a thickness of 1 µm. The contact layer 16 is made of p-type GaAs with a thickness of 0.5 µm, and is arranged in an upper part of the ridge 17.

Moreover, in the laser diode device 1, an upper electrode 21 is arranged on the contact layer 17, and a lower electrode 22 is arranged on the back surface of the substrate 10. In this case, the upper electrode 21 is formed by laminating, for example, a titanium (Ti) layer, a platinum (Pt) layer and a gold (Au) layer in this order from the contact layer 17, and is electrically connected to the contact layer 17. Moreover, the lower electrode 22 has, for example, a configuration in which a layer of an alloy of Au and germanium (Ge), a nickel (Ni) layer and an Au layer are laminated in this order from the substrate 10, and is electrically connected to the substrate 10.

For example, the laser diode device 1 is connected to the heat sink 3 with the solder 2 in between on a side closer to the lower electrode 22.

The solder 2 is provided to fix the laser diode device 1 on the heat sink 3, and to efficiently transmit a stress from the heat sink 3 to the laser diode device 1. In this case, the solder 2 is made of a solder material with a high melting point, good wettability and ease of formation, for example, hard solder with a melting point of 200° C. or over such as AuSn (with a melting point of 280° C.), SnAg (with a melting point of 221° C.), SnAgCu (with a melting point of 216° C. to 220° C.), AuGe (with a melting point of 356° C. to 680° C.) or AuSb (with a melting point of 360° C. to 1020° C.).

The heat sink 3 is made of a material with a different thermal expansion coefficient from that of the laser diode device 1, for example, copper (Cu) or aluminum (Al) with a higher thermal expansion coefficient than that of the laser diode device 1. A relationship between a bonding temperature and a strain when the heat sink 3 is made of Cu or Al in the case where a GaAs substrate is used as the substrate 10 is shown in FIG. 2.

Figure 2:
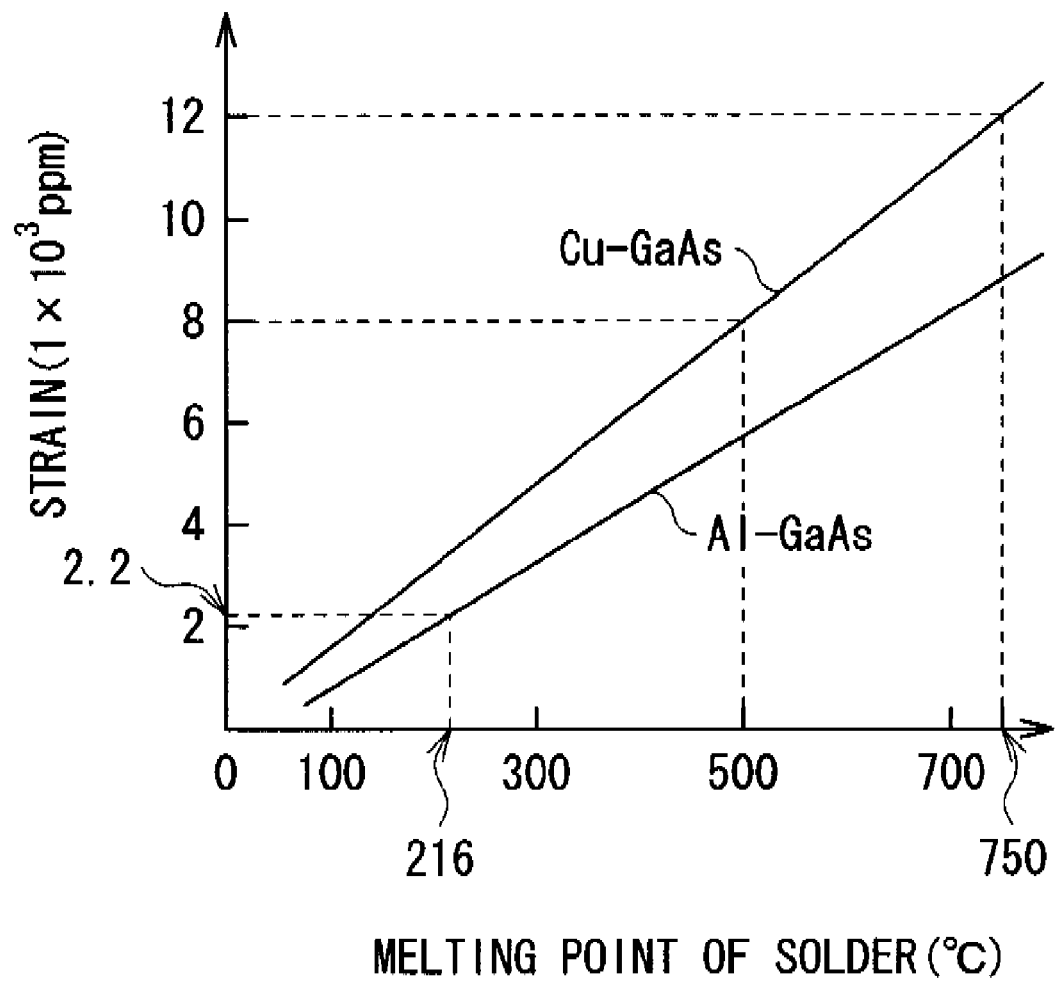
FIG. 2 is a plot showing a relationship between a bonding temperature and a strain.

In this case, a strain amount shown in a vertical axis of FIG. 2 is represented, for example, by a ratio of change between before and after a strain is applied in the width of the laser diode device 1 in a direction parallel to a direction where a strain is applied, and, for example, as shown in the following Formula 1, the strain amount can be obtained by subtracting a width W2 of a bar-shaped device after mounted on the heat sink 3 with the solder 2 in between from a width W1 (a thickness in a direction orthogonal to the extending direction of the ridge 17) of a bar-shaped device before dividing the laser diode device 1 into chips in a manufacturing step to obtain a value, and then dividing the value by the width W1. The strain amount shown in the vertical axis of the FIG. 2 can be obtained by a method other than the above-described method, and, for example, as shown in the following Formula 2, the strain amount can be obtained by subtracting a width W4 between light emission spots when a current is applied to the bar-shaped device to emit light in a state in which the bar-shaped device is mounted on the heat sink 3 with the solder 2 in between from a width W3 between light emission spots when a current is applied to the bar-shaped device to emit light in a state in which the bar-shaped device is not mounted on the heat sink 3 to obtain a value, and then dividing the value by the width W3.

$$\text{Strain amount} = (W1 - W2)/W1 \quad (1)$$

$$\text{Strain amount} = (W3 - W4)/W3 \quad (2)$$

As shown in FIG. 2, when the solder 2 is made of a solder material with a melting point of 750° C., at 750° C. at which an adverse effect by high temperature is not exerted on the laser diode device 1, a compressive strain of approximately 12000 ppm can be applied to the laser diode device 1; however, in the case where the maximum bonding temperature is set to a temperature (500° C.) to an extent to which a reaction between the laser diode device 1 and the upper electrode 21 and the lower electrode 22 does not start, when the solder 2 is made of a solder material with a melting point of 500° C., at 500° C., a compressive strain of approximately 8000 ppm can be applied to the laser diode device 1. Further, in the case where the minimum bonding temperature is set to the melting point of the solder 2, when the solder 2 is made of a solder material with a melting point of 216° C., at 216° C., a compressive strain of approximately 2200 ppm can be applied to the laser diode device 1. Thus, the higher the melting point of the solder 2 is, the more the strain amount applied to the laser diode device 1 can be increased, so it is found out that in the case where it is desired to increase the compressive strain applied to the laser diode device 1, the melting point of the solder 2 is set to be higher.

The laser diode with such a configuration can be manufactured by the following steps, for example.

To manufacture the AlGaInP-based laser diode device 1, a compound semiconductor layer on the substrate 10 is formed by, for example, a MOCVD (Metal Organic Chemical Vapor Deposition) method. At this time, as materials of a Group III-V compound semiconductor, for example, trimethylaluminum (TMA), trimethylgallium (TMG), trimethylindium (TMIn), and phosphine (PH3) are used, and as a material of a donor impurity, for example, $H_2Se$ is used, and as a material of an acceptor impurity, for example, dimethylzinc (DMZ) is used.

More specifically, at first, the lower cladding layer 11, the lower guide layer 12, the active layer 13, the upper guide layer 14, the upper cladding layer 15 and the contact layer 16 are laminated in this order on the substrate 10. At this time, the flow rates of TMIn and TMG are adjusted so that the active layer 13 has a predetermined lattice mismatch with the substrate 10, and the flow rate of TMA is adjusted so that each layer has a predetermined Al composition.

Next, for example, a mask layer is formed on the contact layer 16, and the contact layer 16 and the upper cladding layer 15 are selectively removed by, for example, a reactive ion etching (RIE) method, and then the mask layer is removed. Thereby, the striped ridge 17 extending in the axial direction is formed in a part of the contact layer 16 and a part of the upper cladding layer 15 so as to correspond to the current injection region of the active layer 13.

Next, for example, the back surface of the substrate 10 is lapped so that the substrate 10 has a thickness of 100 μm, and the lower electrode 22 is formed in order on the back surface of the substrate 10. Moreover, the upper electrode 21 is formed on the contact layer 16. Thus, the laser diode device 1 shown in FIG. 1 is formed.

Next, after setting the temperature of the laser diode device 1 to a predetermined temperature, the laser diode device 1 with the lower electrode 22 side down is bonded to the heat sink 3 with the solder 2 in between, and they are cooled in a state in which they are bonded together. Thus, the laser diode according to the embodiment is manufactured.

Next, functions and effects of the laser diode according to the embodiment will be described below.

In the laser diode according to the embodiment, when a predetermined voltage is applied between the upper electrode 21 and the lower electrode 22, a current is confined by the ridge 17, and the current is injected into the current injection region of the active layer 13, thereby light is emitted by the recombination of electrons and holes. The light is reflected by a reflecting mirror (not shown) formed by a pair of an end surface on a light emission side and an end surface on a back side, and laser oscillation occurs at a predetermined wavelength, and the light is emitted to outside as a laser beam.

In general, when the composition ratio of an element included in a compound semiconductor is changed, a band gap is changed accordingly. Moreover, when an external stress is applied to a compound semiconductor, a strain occurs in the compound semiconductor, thereby a band gap is changed. In this case, the external stress can be generated, for example, by bonding materials with different thermal expansion rates together at high temperature, and then cooling the materials; however, the external stress can be also generated by growing a crystal of a material which is lattice-mismatched with a substrate on the substrate.

Therefore, in the embodiment, for example, in the case where a GaAs substrate is used as the substrate 10, and the active layer 13 is made of GaInP, when a Ga composition ratio in the active layer 13 is set so that the active layer 13 is lattice-mismatched with the substrate 10, the band gap of the active layer 13 has a different value (refer to a dashed-dotted line A in FIG. 3) from that of the band gap of the active layer 13 in the case where the active layer 13 is lattice-matched with the substrate 10, and an external stress acts on the active layer 13. Thus, when the external stress acts on the active layer 13, the external stress causes a strain in the active layer 13, and the band gap of the active layer 13 is changed (refer to a dashed-two dotted line B in FIG. 3). Therefore, in the case where the active layer 13 which is lattice-mismatched with the substrate 10 is formed on the substrate 10, the band gap of the active layer 13 is changed because of not only the composition ratio but also the strain, so the change amount Δ Eg of the band gap in the active layer 13 is actually a total value of the change amount of a band gap caused by the composition ratio and the change amount of a band gap caused by the strain (refer to a solid line C in FIGS. 3 and 5).

Figure 4:
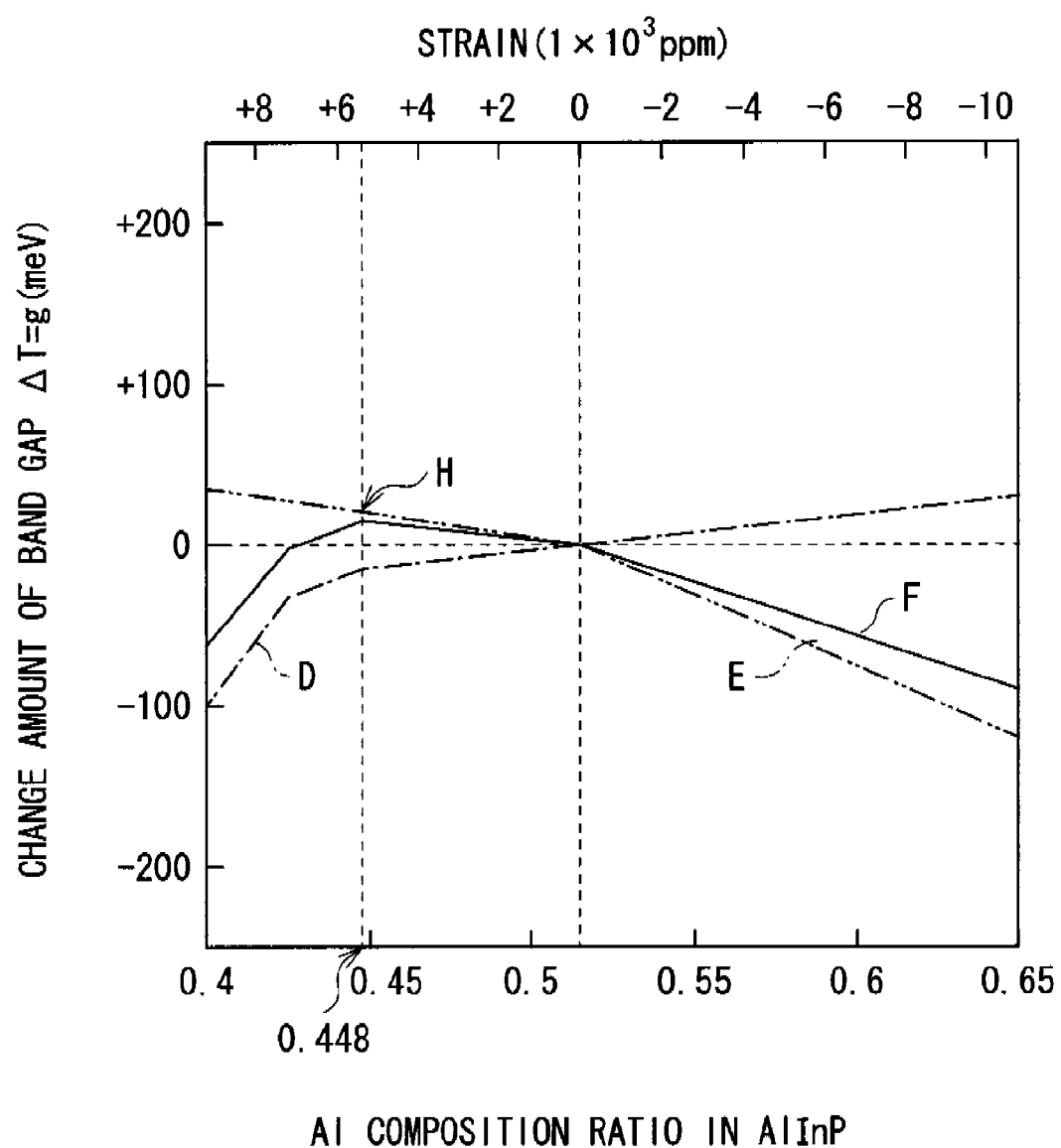
FIG. 4 is a plot showing a relationship between an Al composition ratio in AlInP and a change amount of a band gap.

Likewise, in the embodiment, for example, in the case where a GaAs substrate is used as the substrate 10, and the upper cladding layer 15 is made of AlInP, when an Al composition ratio in the upper cladding layer 15 is set so that the upper cladding layer 15 is lattice-mismatched with the substrate 10, the change amount Δ Eg of a band gap in the upper cladding layer 15 is actually the total value (refer to a solid line F in FIGS. 4 and 5) of the change amount of a band gap caused by the composition ratio (refer to a dashed-dotted line D in FIG. 4) and the change amount of a band gap caused by a strain (refer to a dashed-two dotted line E in FIG. 4).

Figure 5:
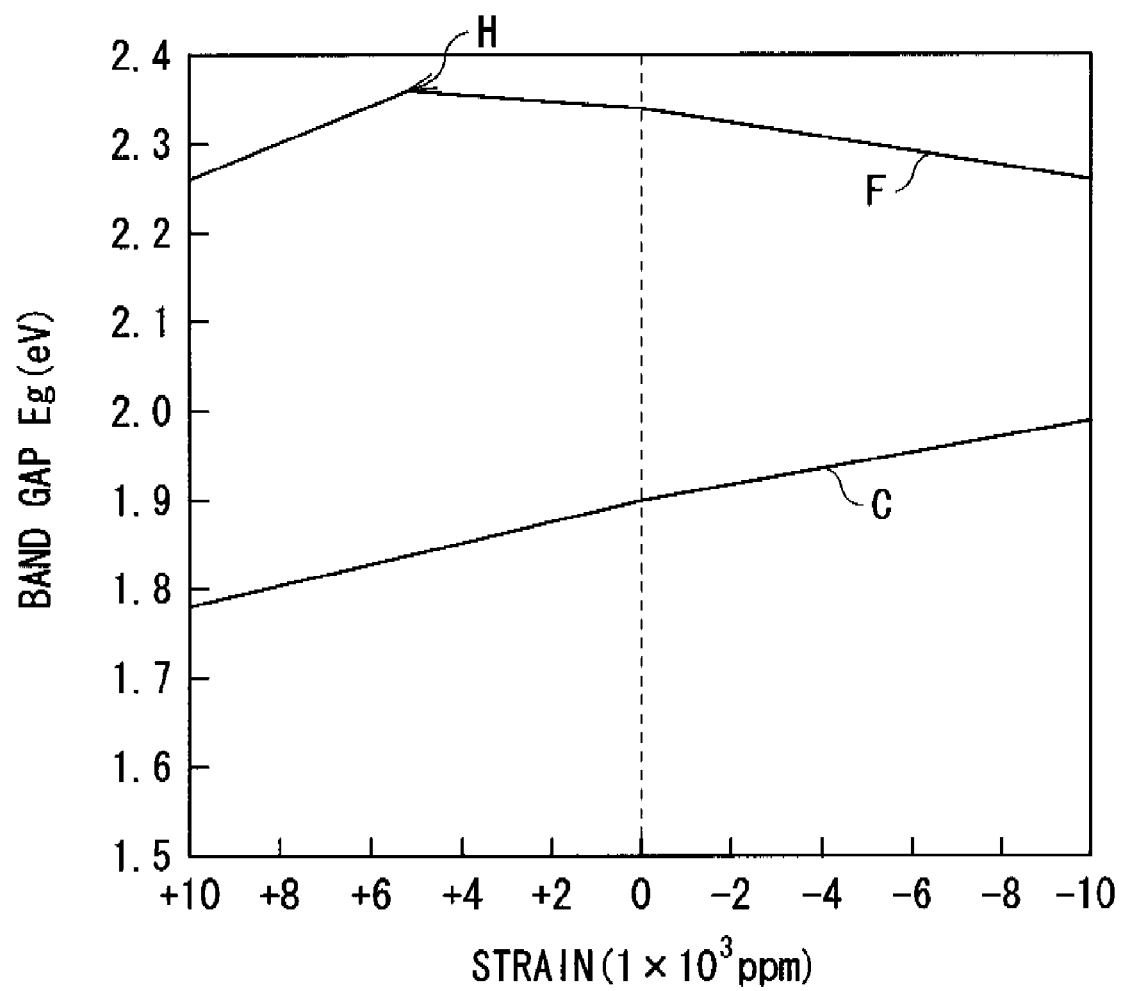
FIG. 5 is a plot showing a relationship between a strain and a band gap.

An apex H in the solid line F in FIGS. 4 and 5 corresponds to the Al composition ratio (0.448) which is changed from direct transition to indirect transition when the Al composition ratio is changed in a direction where the Al composition ratio is increased. Moreover, in FIG. 5, the vertical axis of the solid line C in FIG. 3 and the solid line F in FIG. 4 is converted into an absolute value.

Figure 3:
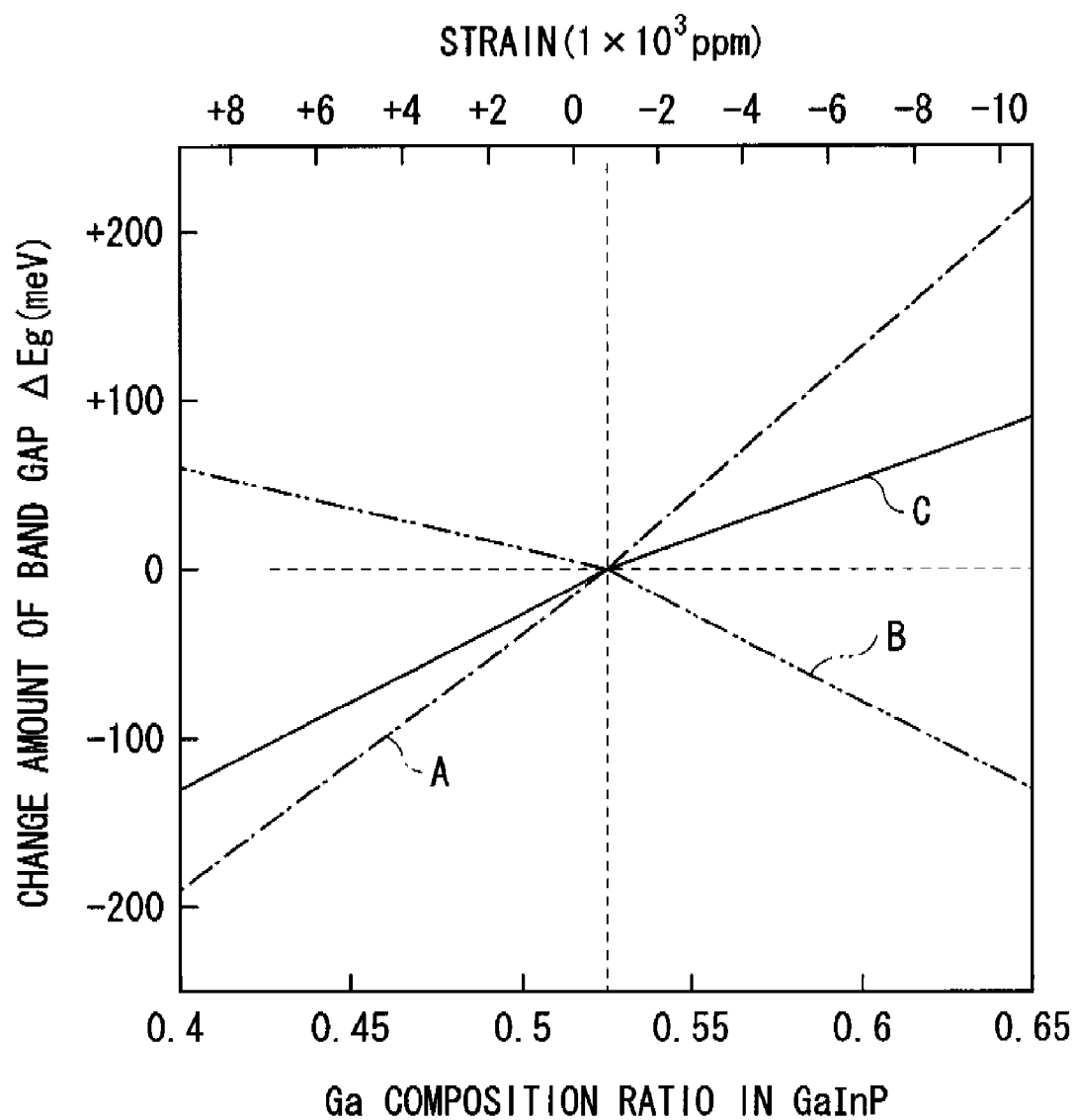
FIG. 3 is a plot showing a relationship between a Ga composition ratio in GaInP and a change amount of a band gap.
Figure 6:
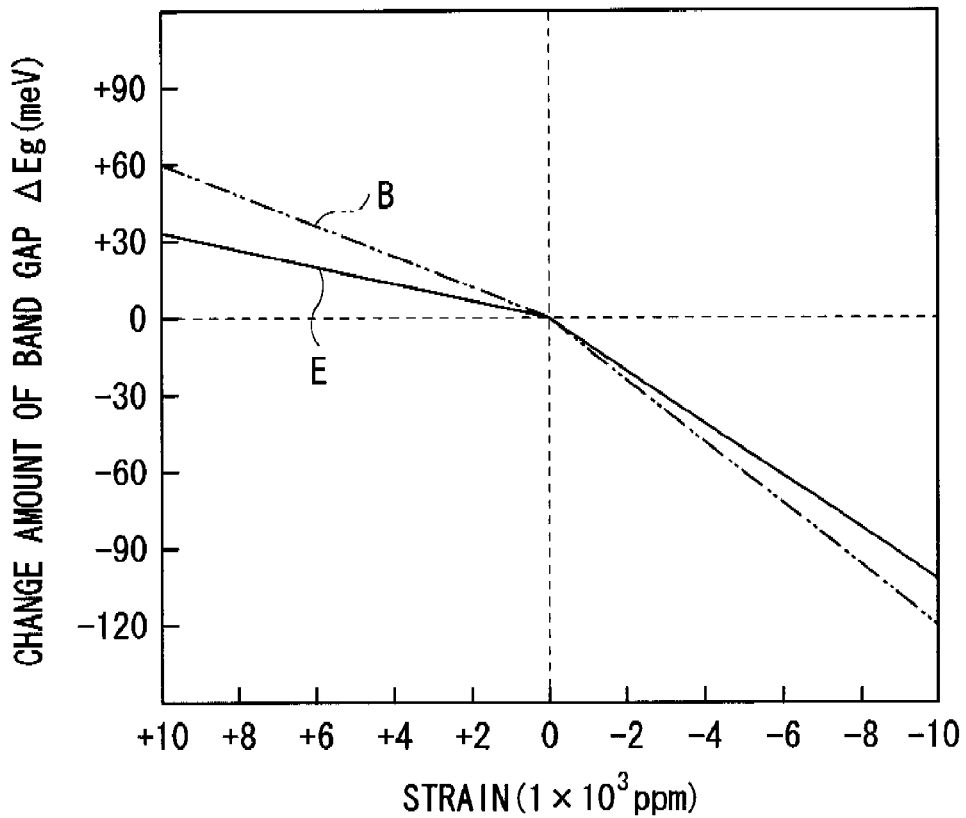
FIG. 6 is a plot showing a relationship between a strain and a change amount of a band gap.

The line B in FIG. 3 and the line E in FIG. 4 are shown in FIG. 6. It is obvious from FIG. 6 that when a strain is applied in a compression direction (a direction from the right to the left in FIG. 6), the change amount of the band gap in AlInP is more modest than the change amount of the band gap in GaInP. Therefore, when a strain is applied to both of AlInP and GaInP in the compression direction, a band gap difference between AlInP and GaInP is gradually reduced. The relationship between B and E shown in FIG. 6 is established not only in the case where the band gap is changed because of a strain caused by a lattice mismatch but also in the case where the band gap is changed because of a strain caused by the application of a stress from the outside of the laminate configuration 20 (for example, the heat sink 3 or the like).

Figure 7:
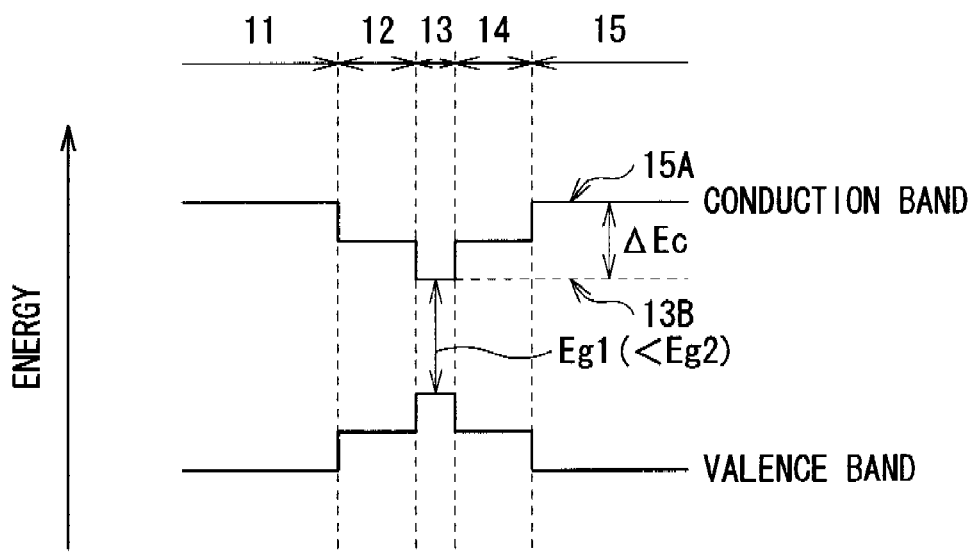
FIG. 7 is a conceptual diagram for describing the band structure of a laser diode device shown in FIG. 1.

Therefore, in the embodiment, a band gap difference between the active layer 13 and the upper cladding layer 15, more specifically an energy difference (an electronic barrier) Δ Ec (refer to FIG. 7) between a bottom 13B of a conduction band (or a subband) (hereinafter simply referred to as the bottom 13B of the conduction band) in the active layer 13 and a bottom 15A of a conduction band (or a subband) (hereinafter simply referred to as the bottom 15A of the conduction band) in the upper cladding layer 15 is increased in advance before the laser diode device 1 is mounted on the heat sink 3.

As measures to increase the electronic barrier ΔEc in advance, for example, it can be considered to increase the energy at the bottom 15A of the conduction band in the upper cladding layer 15. However, among Group III-V compound semiconductors, a material which is lattice-matched with the substrate 10 and has a large energy at the bottom of a conduction band is limited to AlInP, AlGaInP or the like, so it is difficult to largely increase the energy at the bottom 15A.

As other measures, for example, it can be considered to reduce a band gap Eg1 of the active layer 13. In this case, to reduce the band gap Eg1 of the active layer 13, as shown by the solid line C in FIG. 5, it is necessary to apply a strain to the active layer 13 in the compression direction. However, for example, in the case where the heat sink 3 is used as a stress source to apply a strain to the active layer 13 in the compression direction, a stress from the stress source is applied not only to the active layer 13 but also to the upper cladding layer 15. As a result, as shown in FIG. 6, the electronic barrier Δ Ec between the active layer 13 and the upper cladding layer 15 is rather reduced. Moreover, when the band gap Eg1 of the active layer 13 is changed, the light emission wavelength of the laser diode device 1 is also changed, so it is difficult to obtain a desired light emission wavelength.

On the other hand, in the embodiment, as shown by the dashed-two dotted line B in FIG. 3, in the case where the active layer 13 is made of GaInP, the Ga composition ratio in GaInP is reduced to change a strain caused by a lattice mismatch in a compression direction (a direction from the right to the left in FIG. 3), and then a compressive stress is applied to the laser diode device 1 from the heat sink 3 as a stress source.

Figure 8:
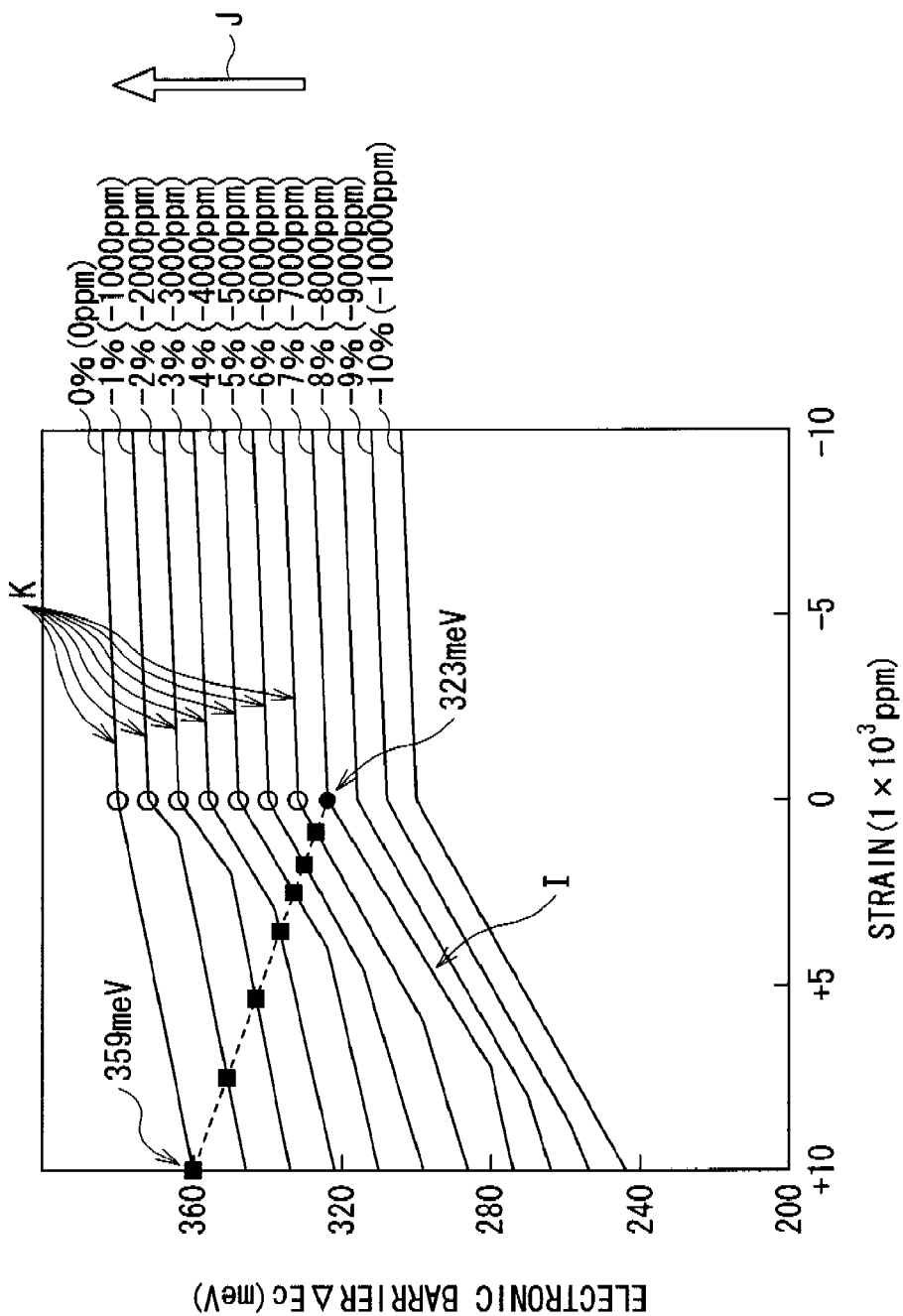
FIG. 8 is a plot showing an example of a relationship between a strain and an electronic barrier.

For example, in a laser diode in a related art in which a tensile stain of approximately −7000 ppm is applied to the active layer 13 (GaInP) from the lower cladding layer 11 and the upper cladding layer 15, and a submount or soft solder is arranged between the laser diode device 1 and the heat sink 3 so as to prevent the application of a strain to the active layer 13 from the heat sink 3, for example, as shown by a black circle around the center of FIG. 8, the electronic barrier Δ Ec is 323 meV.

At this time, instead of the submount or the soft solder, the solder 2 made of the above-described hard solder is arranged between the laser diode device 1 and the heat sink 3, and in a state in which the strain amount applied to the active layer 13 from the lower cladding layer 11 and the upper cladding layer 15 is kept constant (approximately −7000 ppm), a stress is applied to the laser diode device 1 from the heat sink 3 to change the strain amount of the active layer 13, thereby a relationship between the strain amount applied from the heat sink 3 to the active layer 13 and the value of the electronic barrier Δ Ec is established as shown by a line I passing through the black circle around the center of FIG. 8.

It is found out from the line I that when a strain is applied to the active layer 13 from the heat sink 3 in a compression direction (a direction from the right to the left in FIG. 8), the value of the electronic barrier Δ Ec is gradually reduced.

Moreover, when in a state in which the submount or the soft solder is arranged between the laser diode device 1 and the heat sink 3, the Ga composition ratio in the active layer 13 is reduced to change a strain caused by a lattice mismatch in a compression direction (a direction indicated by an arrow J in FIG. 8), as shown by white circles around the center of FIG. 8, the electronic barrier Δ Ec becomes larger than 323 meV.

At this time, as in the above-described case, the solder 2 made of the above-described hard solder is arranged between the laser diode device 1 and the heat sink 3 instead of the submount or the soft solder, and in a state in which the strain amount applied to the active layer 13 from the lower cladding layer 11 and the upper cladding layer 15 is kept constant, a stress is applied to the laser diode device 1 from the heat sink 3 to change the strain amount of the active layer 13, thereby a relationship between the strain amount applied from the heat sink 3 to the active layer 13 and the value of the electronic barrier Δ Ec is established as shown by a line K passing through each white dot around the center of FIG. 8.

As in the case of the line I, the line K has a tendency that when a strain is applied from the heat sink 3 to the active layer 13 in a compression direction (a direction from the right to the left in FIG. 8), the value of the electronic barrier Δ Ec is gradually reduced; however, when a black square is arranged at a point with the same light emission wavelength as that of the black circle on the line I, the values of the electronic barrier Δ Ec at all black squares are larger than that at the black circle on the line I.

In other words, in the case where the active layer 13 is made of GaInP, the Ga composition ratio in GaInP is reduced, and a strain caused by a lattice mismatch is changed in a compression direction (a direction indicated by the arrow J in FIG. 8), and after that, a compressive stress is applied to the laser diode device 1 from the heat sink 3 as a stress source, the value of the electronic barrier Δ Ec can be increased in a state in which the light emission wavelength is kept constant.

In FIG. 8, the case where a strain caused by a lattice mismatch is a compressive strain (+0 ppm or over) is not described; however, even in such a case, as in the case where a strain caused by a lattice mismatch is a tensile strain, or as in the case where there is no strain, in a state in which the light emission wavelength is kept constant, the value of the electronic barrier Δ Ec can be increased. Moreover, in the case where it is not necessary for the light emission wavelength to be equal to that at the black circle on the line I, a range in which the value of the electronic barrier Δ Ec is larger than that at the black circle on the line I can be selected on the line K.

Figure 9:
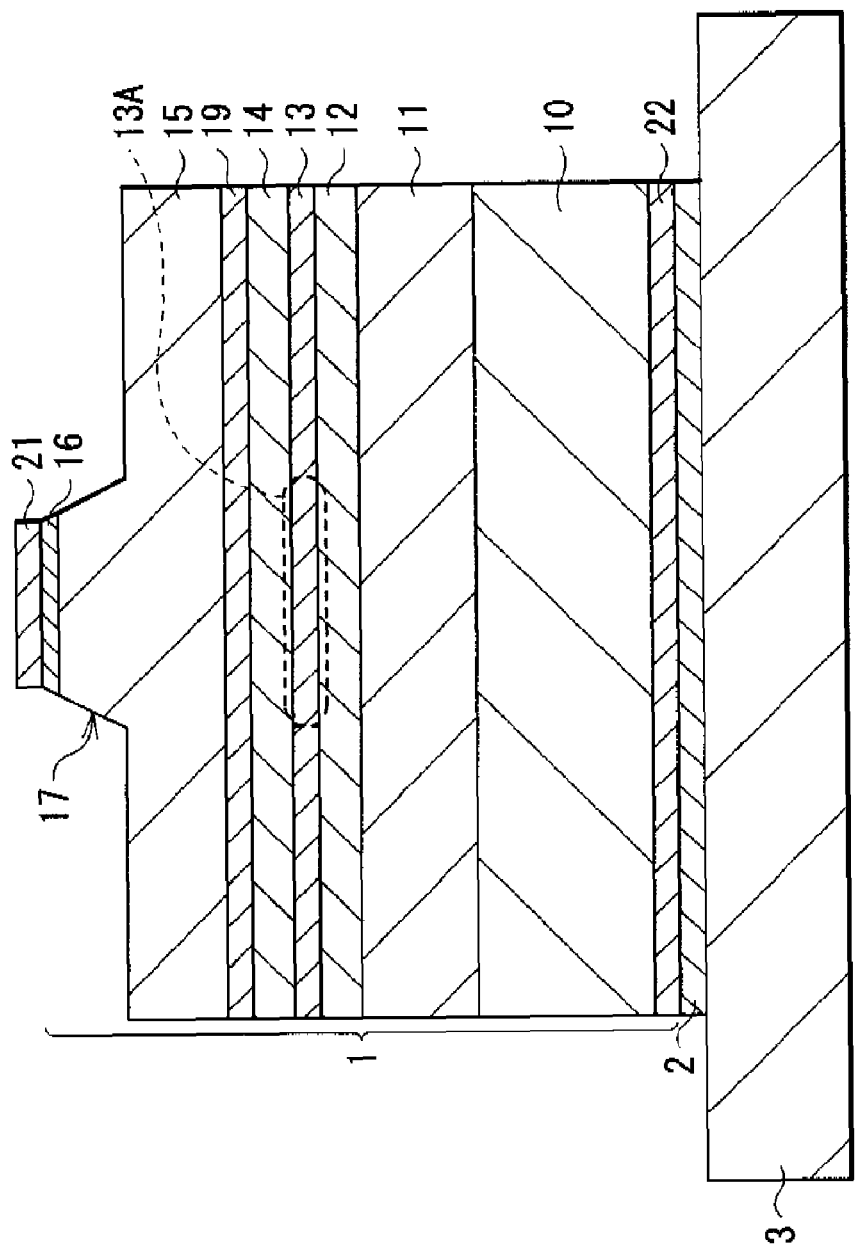
FIG. 9 is a sectional view of a modification of the laser diode shown in FIG. 1.
Figure 10:
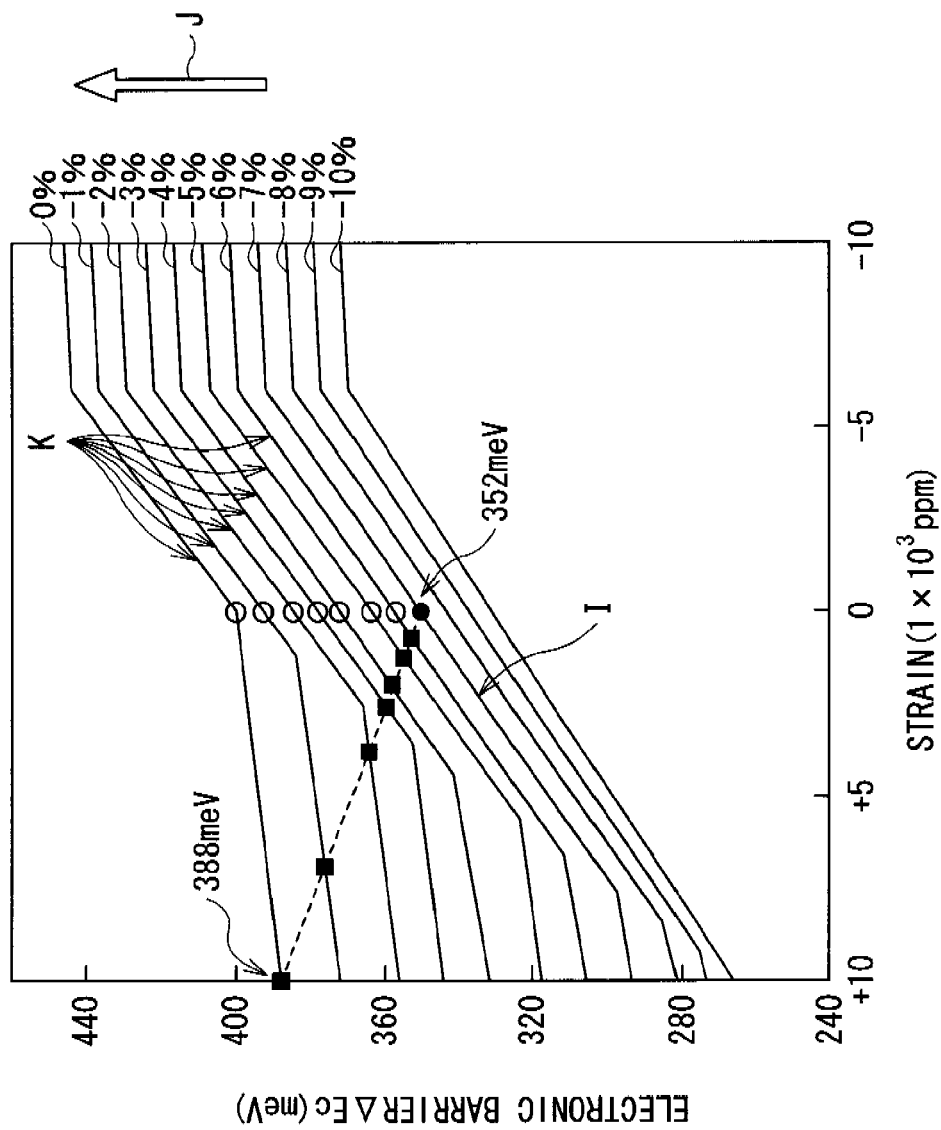
FIG. 10 is a plot showing another example of a relationship between a strain and an electronic barrier in the laser diode shown in FIG. 9.
Figure 11:
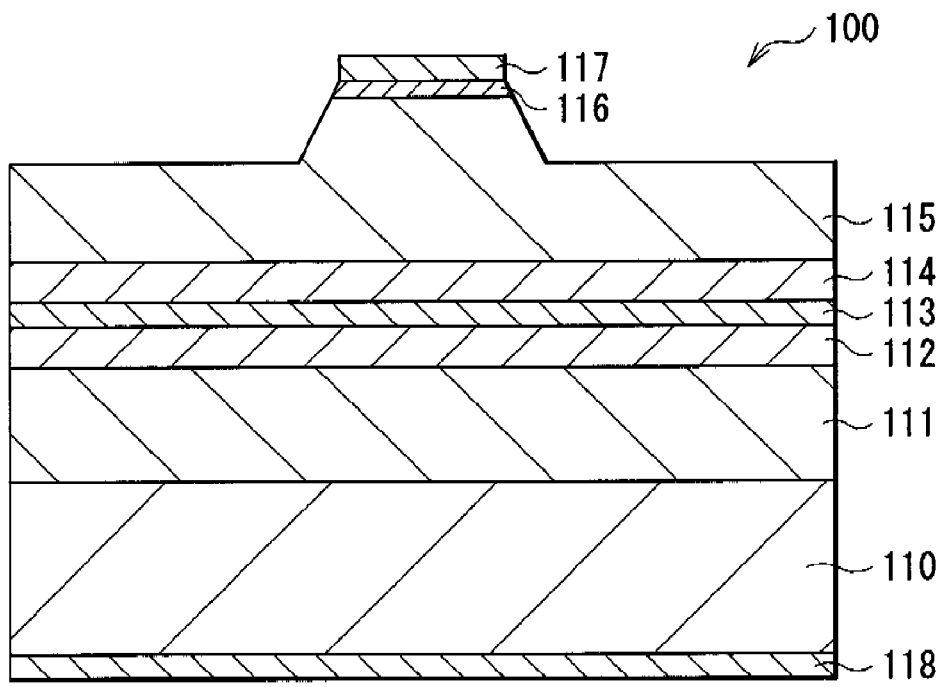
FIG. 11 is a sectional view of a laser diode in a related art.
Figure 12:
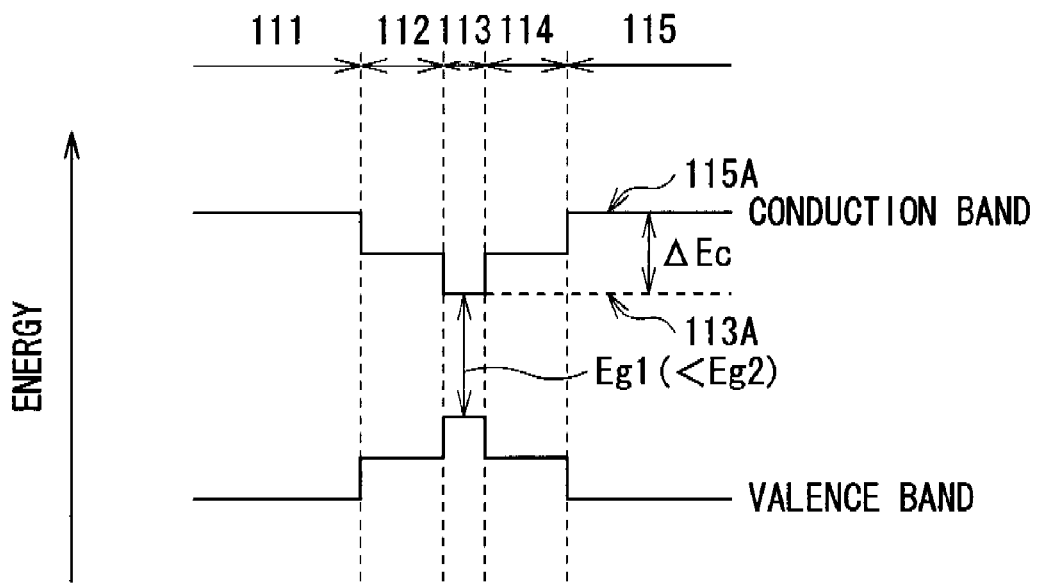
FIG. 12 is a conceptual diagram for describing the band structure of a laser diode device shown in FIG. 11.

Moreover, as shown in FIG. 9, in the case where an electronic barrier layer 19 including a material (for example, $Al_{0.448}In_{0.552}P$) having a larger energy at the bottom of a conduction band than that of the upper cladding layer 15 is arranged between the upper guide layer 14 and the upper cladding layer 15, as shown in FIG. 10, the value of the electronic barrier Δ Ec can be further increased. In addition, in the case where the substrate 10 is a GaAs substrate, $Al_{0.448}In_{0.552}P$ described above is not lattice-matched with the substrate 10, so it is necessary for $Al_{0.448}In_{0.552}P$ to be thin enough to prevent the occurrence of lattice relaxation.

As described above, in the embodiment, the value of the electronic barrier Δ Ec can be increased, so carrier overflow can be prevented. Thereby, high-temperature operation can be implemented. Moreover, when carrier overflow is prevented, the value of a threshold current can be reduced. Further, heat generation can be also prevented, so an increase in crystal faults which occur due to heat can be also prevented. As a result, reliability during long-term operation can be improved.

Although the present invention is described referring to the embodiment, the invention is not limited to the above-described embodiment, and can be variously modified.

It should be understood by those skilled in the art that various modifications, combinations, sub-combinations and alterations may occur depending on design requirements and other factors insofar as they are within the scope of the appended claims or the equivalents thereof.

What is claimed is:

1. A laser diode comprising an AlGaInP-based laminate configuration, the AlGaInP-based laminate configuration further including:
   a lower cladding layer;
   a lower guide layer above the lower cladding layer;
   an active layer above the lower guide layer;
   an upper guide layer above the active layer;
   an electron barrier layer on the upper guide layer;
   and an upper cladding layer above the electron barrier layer,
   wherein,
      the AlGaInP-based laminate configuration receives a compressive stress of more than 2200 ppm from a stress source, and
      the electron barrier layer has a band gap that is greater than those of the lower cladding layer and the upper cladding layer.

2. The laser diode according to claim 1, wherein the compressive stress is 12000 ppm or less.

3. The laser diode according to claim 1, comprising:
   a mounting board as the stress source on which the AlGaInP-based laminate configuration is mounted.

4. The laser diode according to claim 3, wherein the AlGaInP-based laminate configuration is directly fixed on the mounting board by solder with a melting point of 200° C. or over.

5. The laser diode according to claim 4, wherein the solder includes AuSn, SnAg, SnAgCu, AuGe or AuSb.

6. The laser diode according to claim 1, wherein the active layer does not receive a stress from the lower cladding layer and the upper cladding layer, or the active layer receives a compressive stress from the lower cladding layer and the upper cladding layer.

7. The laser diode according to claim 1, wherein the active layer mainly includes GaInP, and the lower cladding layer and the upper cladding layer mainly include AlInP.

8. The laser diode according to claim 1, wherein, the electron barrier layer includes a $Al_{0.448}In_{0.552}$ material.

* * * * *